United States Patent [19]
Sato et al.

[11] Patent Number: 5,469,399
[45] Date of Patent: Nov. 21, 1995

[54] SEMICONDUCTOR MEMORY, MEMORY CARD, AND METHOD OF DRIVING POWER SUPPLY FOR EEPROM

[75] Inventors: Toshiro Sato; Tomoharu Tanaka; Tetsuhiko Mizoguchi; Yuji Ide, all of Yokohama, Japan

[73] Assignee: Kabushiki Kaisha Toshiba, Kawasaki, Japan

[21] Appl. No.: 213,058

[22] Filed: Mar. 15, 1994

[30] Foreign Application Priority Data

Mar. 16, 1993 [JP] Japan ................... 5-056187

[51] Int. Cl.⁶ ................................. G11C 16/02
[52] U.S. Cl. .................... 365/226; 365/227; 327/530; 327/538
[58] Field of Search .................... 365/226, 227, 365/228, 229; 307/296.1, 296.6, 296.8; 327/530, 538, 544

[56] References Cited

U.S. PATENT DOCUMENTS 5,172,342  12/1992  Gochi .................... 365/226
5,267,211  11/1993  Kobayashi .................... 365/228
5,267,218  11/1993  Elbert .................... 365/226

FOREIGN PATENT DOCUMENTS 61-80598  4/1986  Japan .

OTHER PUBLICATIONS

John F. Dickinson, "On–Chip High–Voltage Generation in MNOS . . . ", 1976, vol. sc–11, No. 3, pp. 374–378.

Primary Examiner—Joseph A. Popek
Assistant Examiner—Son Mai
Attorney, Agent, or Firm—Oblon, Spivak, McClelland, Maier & Neustadt

[57] ABSTRACT

A DC—DC converter using a planar inductor is arranged in an IC memory card incorporating an EEPROM memory chip, and power supply is performed such that a voltage is adjusted by a dropping regulator, thereby reducing power consumption. The power consumption of the IC memory card incorporating the EEPROM can be reduced. The IC card can be driven by a single power supply, thereby providing a compact portable information device which can be driven by a battery for a long time.

20 Claims, 10 Drawing Sheets

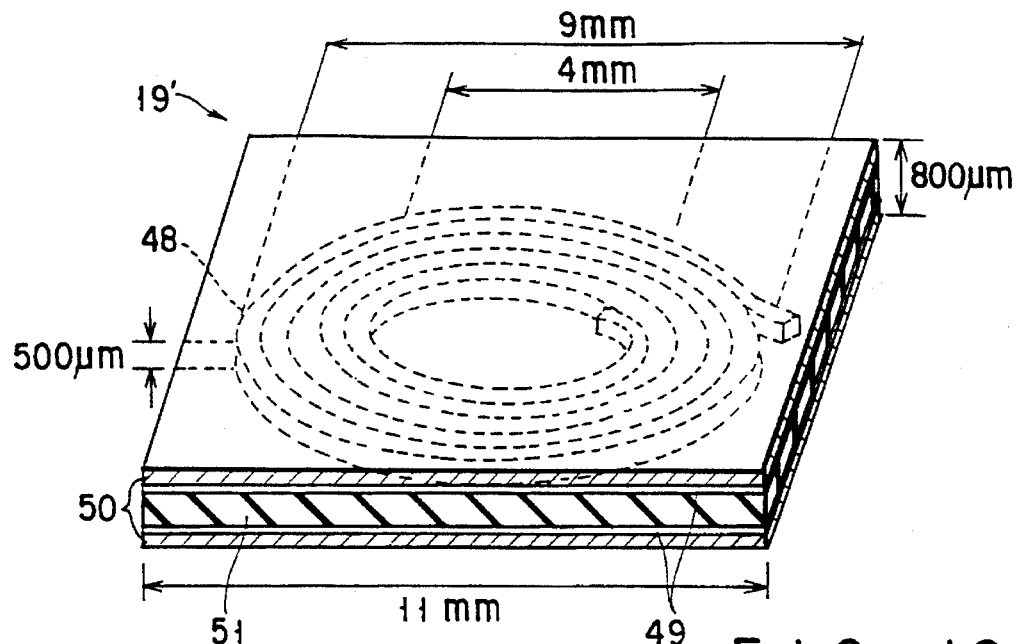
F I G. 12
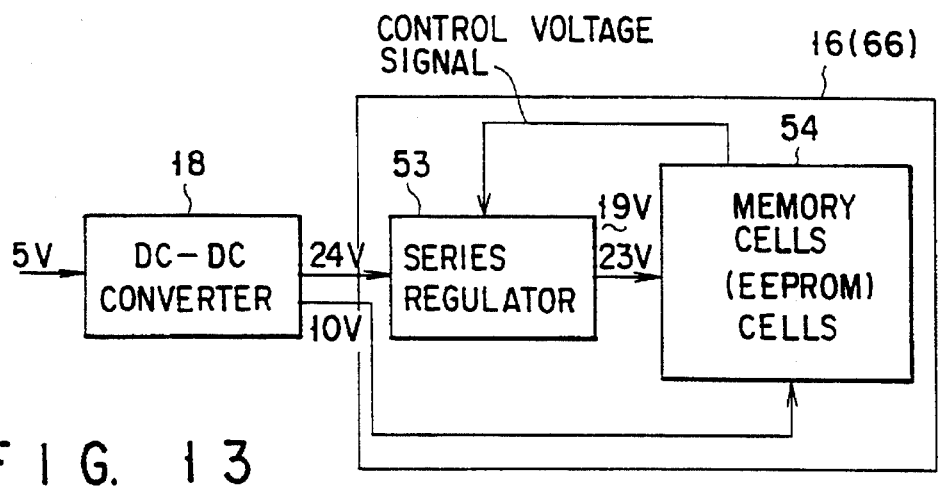
F I G. 13
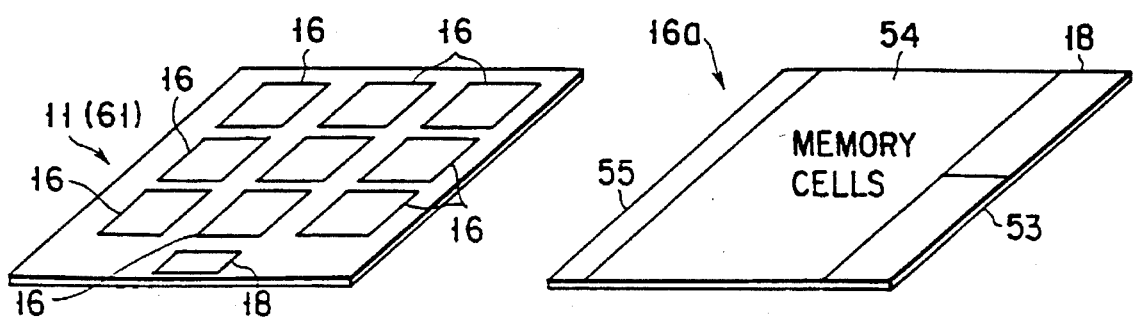
F I G. 14A    F I G. 14B

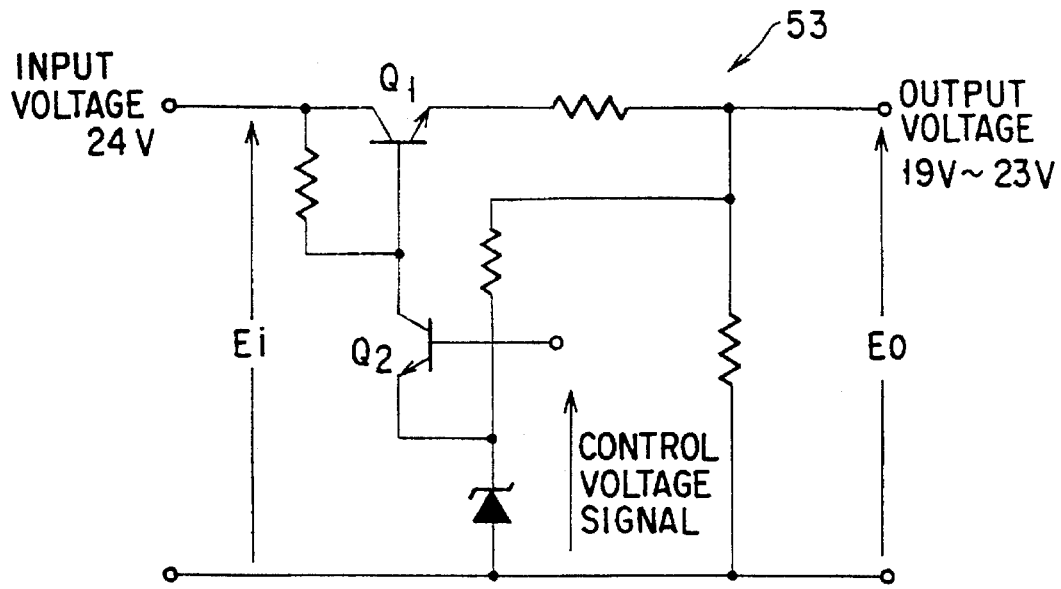
FIG. 16
FIG. 17A  CONTROL PULSE
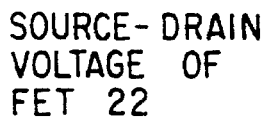
FIG. 17B  SOURCE-DRAIN VOLTAGE OF FET 22
FIG. 17C  CURRENT $I_D$ FLOWING IN INDUCTOR 19
FIG. 17D  OUTPUT CURRENT $I_d$ FROM DIODE 23
FIG. 17E  OUTPUT CURRENT $I_0$

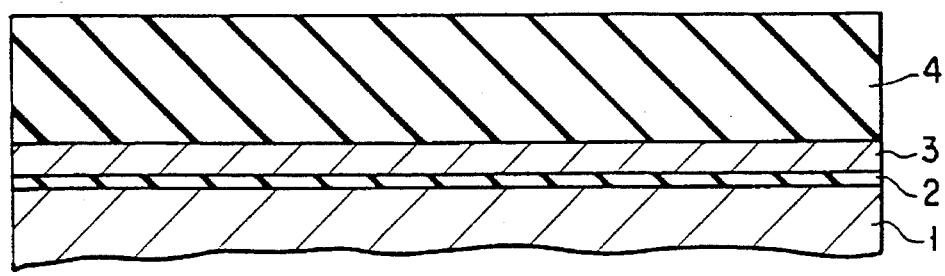
F I G. 18A
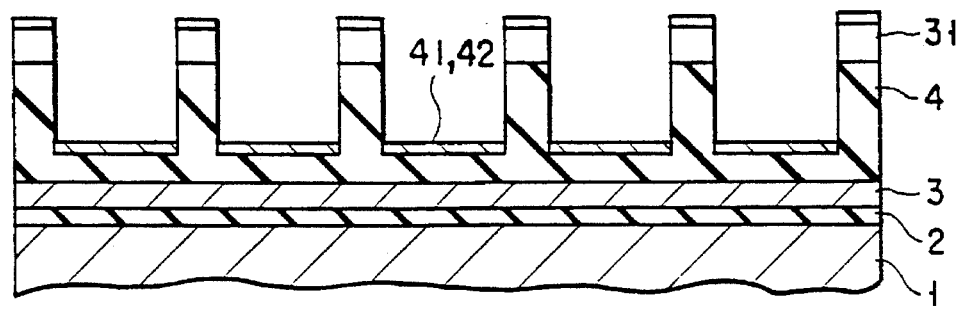
F I G. 18B
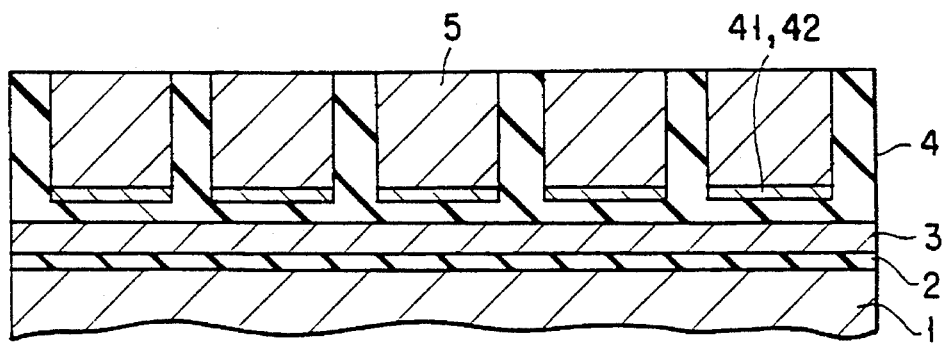
F I G. 18C
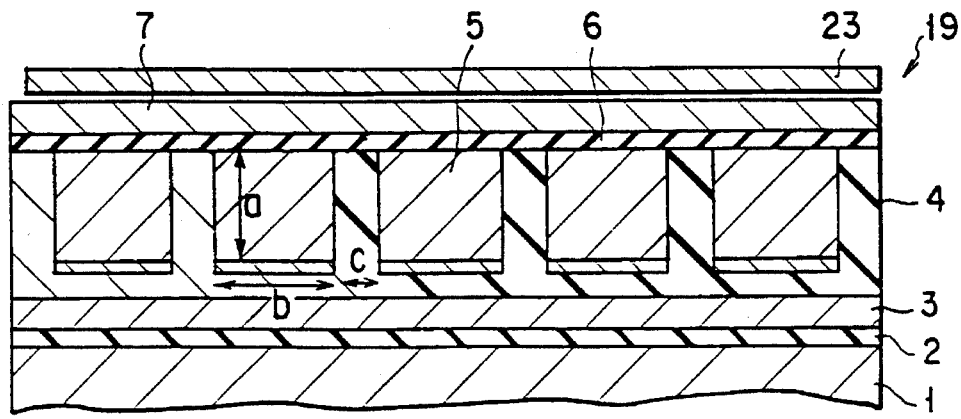
F I G. 18D

SEMICONDUCTOR MEMORY, MEMORY CARD, AND METHOD OF DRIVING POWER SUPPLY FOR EEPROM

BACKGROUND OF THE INVENTION

1. Field of the Invention

The present invention relates to a semiconductor memory such as an EEPROM having a highly efficient power supply circuit, to a memory card using EEPROMs, and to a method of driving a power supply for the EEPROM.

2. Description of the Related Art

In recent years, an IC memory card begins to be popularly used as an IC memory card having the same size as that of a credit card, and standardization thereof is performed in the field of compact information devices such as portable personal computers. For example, Japanese Electronic Industry Development Association (JEIDA) recommends JEIDA-GI-1991 "IC memory card guide line Ver. 4.1" as the standard specifications of a memory card for a personal computer. This standard is the same as PC Card Standard Release 2.0 of PCMCIA (Personal Computer Memory Card International Association) in the U.S.A., and substantially becomes an international standard.

FIGS. 1 and 2 are perspective views showing the outer appearances of IC cards to show card sizes defined by "IC memory card guide line Ver. 4.1" of JEIDA, respectively. As a physical size, each IC memory card has a size equal to that of a credit card, e.g., the short side of 54.0 mm and the long side of 85.6 mm. The thicknesses of the IC memory cards are defined as 3.3 mm (TYPE I) and 5.0 mm (TYPE II), respectively. A connector portion 71 of the short side of each IC memory card has 68 pins and a thickness of 3.3 mm. Reverse insertion preventive guide grooves 72 and 73 are formed on both the sides of the connector portion of each card. The connector portion 71 and long side portions 74 of each of the IC memory cards of TYPE I and TYPE II are a called connection portion, and the connection portion of each of the IC memory cards of TYPE I and TYPE II has a thickness of 3.3 mm. In the IC memory card of TYPE II, a central portion called a base portion 75 vertically extends, and has the maximum thickness of 5.0 mm. As memories which can be mounted on each IC card, a mask ROM, an OTPROM, an EPROM, an EEPROM, a flash memory, and an SRAM are defined. JEIDA also defines "DRAM card guide line Ver. 1.0" related to an IC memory card incorporating a DRAM. In this manner, various ROMs, various RAMs, and the like are mounted on memory cards. As a programmable memory which requires no backup power supply for holding data, an EEPROM or a flash memory is known. As a typical EEPROM, a NAND EEPROM and a NOR EEPROM are known. However, in recent years, both the NAND and NOR EEPROMs are batch-erase type EEPROMs called flash EEPROMs. The flash memory is a kind of EEPROMs (Electrically Erasable Programmable Read Only Memories), and may be called a flash EEPROM. Since the NAND EEPROM uses a Fowler-Nordheim tunnel current, the power consumption of the NAND EEPROM is small. For this reason, the NAND EEPROM incorporates a booster in its memory chip. The booster generates voltages of 10 V and 20 V required for write/erase operations from an external 5 V power supply, so that the NAND EEPROM can be operated by a single 5 V power supply. On the other hand, since a recent NOR EEPROM uses hot-electron injection, power consumption increases in a write operation. Thus the NOR EEPROM cannot incorporate a booster and therefore requires two external power supplies, i.e., 5 and 12 V power supplies. However, the NOR EEPROM may be of an FN tunneling type in the future.

FIG. 3 is a block diagram showing the schematic arrangement of an IC memory card incorporating a NAND EEPROM. A 68-pin connector defined by "PCMCIA Release 2.0" is arranged in a memory card main body 91, and the 68 pin connector is constituted by address connection pins 12, data bus connection pins 13, control bus connection pins 14, and a power supply pin 15, and the like. A NAND EEPROM 96 and a control IC 17 are mounted in the memory card 91. Although the NAND EEPROM 96, which is practically used at present, such as a 4 Mbit NAND EEPROM TC584000 available from Toshiba Corporation can be operated by a single 5 V power supply, the NAND EEPROM 96 incorporates a booster 97 for generating high voltages of about 10 V and 20 V required for write/erase operations, as described above. This booster 97, for example, as shown in FIG. 4, is a circuit constituted by combining capacitors $80_1$ to $80_n$, transistor switches $81_1$ to $81_n$, $82_1$ to $82_n$, and $83_1$ to $83_n$, and using a scheme called a charge pump scheme (Jpn. Pat. Appln. KOKAI Publication No. 61-80598). In this booster 97, since the resistance loss of each transistor switch and dielectric loss of each capacitor are large, a power conversion efficiency of about 20% is obtained at most. However, since the power consumption of the NAND EEPROM is relatively small and requires a current of about 60 mA in write/erase operations, the NAND EEPROM is practically used such that the NAND EEPROM incorporates the booster 97 and can be operated by a single power supply. However, in a battery-driven portable information device or the like, a decrease in power consumption is required to make a long time operation possible.

FIG. 5 is a block diagram showing the schematic arrangement of an IC memory card incorporating a NOR flash memory. A 68-pin connector defined by PCMCIA Release 2.0 is arranged in a memory card main body 101, and the 68-pin connector is constituted by address bus connection pins 12, data bus connection pins 13, control bus connection pins 14, power supply pins 15 and 106, and the like. A NOR flash memory 66 and a control IC 67 are mounted in the memory card 101. A prior art using the NOR EEPROM 66 will be described below. For example, 5 V and 12 V power supplies must be arranged for an 8 Mbit flash memory 28F008SA available from Intel Corporation. Each of the 5 V and 12 V power supplies has a large power consumption, i.e., about 30 mA. When the NOR EEPROM incorporates a booster having a low power supply efficiency, the power consumption more increases. For this reason, the NOR EEPROM incorporates no booster. That is, the NOR flash memory 66 incorporates no booster for generating a high voltage of 12 V required for write and erase operations. Therefore, an IC memory card requires two types of power supplies.

In this manner, an EEPROM or a flash memory requires a high-voltage power supply in write/erase operations. In an IC memory card incorporating these memories, when a booster-incorporating memory such as a NAND EEPROM is used, a power supply efficiency decreases. On the other hand, when a memory such a NOR EEPROM to which a power supply voltage is externally applied is used, two power supplies are required. That is, although the NAND memory has a low power consumption, since its conventional power supply unit uses a circuit using a charge pump scheme, the NAND memory has a low efficiency. A booster for an EEPROM having a high conversion efficiency has not been developed. When a decrease in power consumption of an IC memory card is considered, a conventional booster is not satisfactorily used. In addition, since the NOR memory basically has a large power consumption, the NOR memory cannot incorporate a power supply. Thus the NOR memory requires a plurality of external power supplies. For this reason, connection between the NOR memory and external power supplies becomes complex.

SUMMARY OF THE INVENTION

The present invention has been made in consideration of the above circumstances, and has as its object to provide a semiconductor memory such as a NAND EEPROM including a highly efficient power supply circuit suitably mounted on one chip or an IC card, and an IC card incorporating this semiconductor memory.

It is another object of the present invention to provide a method of driving a power supply, for an EEPROM, capable of supplying a power from an external power supply to the EEPROM at a high conversion efficiency of a power supply.

According to an aspect of the present invention, there is provided a semiconductor device comprising a semiconductor element driven by a predetermined DC power supply voltage, and a power supply circuit including a DC—DC converter for converting an input DC voltage to an output DC voltage by means of a switching converter scheme using an inductance element and a switching element and a regulator for converting the output DC voltage to the predetermined DC power supply voltage to supply the predetermined DC power supply voltage to the semiconductor element.

According to another aspect of the present invention, there is provided a semiconductor memory comprising memory cells formed on a chip and driven by a predetermined DC power supply voltage, and a micro boosting power supply circuit having a booster type DC—DC converter for boosting an input DC voltage by means of a switching converter scheme using an inductance element and a switching element to generate an output DC voltage and a dropping regulator for dropping the output DC voltage to the predetermined DC power supply voltage to supply the predetermined DC power supply voltage to the memory cells.

According to still another aspect of the present invention, there is provided a memory card comprising a semiconductor memory constituted by a plurality of memory cells driven by a predetermined DC power supply voltage, a micro boosting power supply circuit having a booster type DC—DC converter for boosting an input DC voltage by means of a switching converter scheme using an inductance element and a switching element to generate an output DC voltage and a dropping regulator for dropping the output DC voltage to the predetermined DC power supply voltage to supply the predetermined DC power supply voltage to the plurality of memory cells, and a control circuit for controlling write/erase operations of the semiconductor memory in accordance with an external control signal.

According to still another aspect of the present invention, there is provided a method of driving a power supply of an EEPROM, comprising the steps of applying a first DC voltage from an external power supply, causing a DC—DC converter to boost the first DC voltage by means of a switching converter scheme using an inductance element and a switching element to convert the first DC voltage to a second DC voltage, dropping the second DC voltage by a dropping regulator to convert the second DC voltage to a predetermined third DC voltage for driving an EEPROM, and applying the third DC voltage to the EEPROM as a drive power supply voltage.

The present inventors have developed and proposed a flat magnetic element. This flat magnetic element basically has a structure in which a flat coil is sandwiched by magnetic materials. The flat magnetic element can be used as a single flat magnetic element, or the flat magnetic element can be formed on a semiconductor chip using a thin-film process to form one chip. On the other hand, as a DC—DC converter, a circuit which uses a switching converter scheme and in which a DC voltage is converted into a high-frequency voltage by a switching element and then rectified to obtain a desired DC voltage is known. When the above flat magnetic element is used to constitute the DC—DC converter, even when the frequency of the DC—DC converter is increased, a desired DC voltage can be applied at a very high efficiency. As a DC—DC converter in which a DC voltage is converted into a high-frequency voltage by a switching element, various circuits such as chopper type, forward type, flyback type circuits can be used. However, since an input voltage to a memory card or the like tends to decrease, a booster type circuit is used. In a boosting operation, the efficiency of a DC—DC converter using a magnetic element is higher than that of a DC—DC converter using a charge pump scheme whose efficiency is low due to the dielectric loss of a capacitor or the like. When power supply is performed by combining the switching type DC—DC converter to a dropping regulator, the conversion efficiency of a power supply voltage of an EEPROM or a memory card can be increased. In addition, a NAND or NOR EEPROM can be used as a semiconductor memory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a perspective view showing the schematic arrangement of another planar inductor according to the present invention;

FIG. 13 is a block diagram showing the connection between the DC—DC converter and a memory;

FIG. 14A is a perspective view showing the arrangement of a memory card according to the present invention;

FIG. 14B is a perspective view showing the arrangement of a memory chip according to the present invention;

FIG. 16 is a circuit diagram showing the arrangement of a series regulator;

FIGS. 17A to 17E are waveform charts for explaining the operation of the DC—DC converter shown in FIG. 15A; and FIGS. 18A to 18D are sectional views for explaining the steps in forming a planar inductor (coil).

DETAILED DESCRIPTION OF THE PREFERRED EMBODIMENTS

Embodiments of the present invention will be described below with reference to the accompanying drawings.

Figure 1:
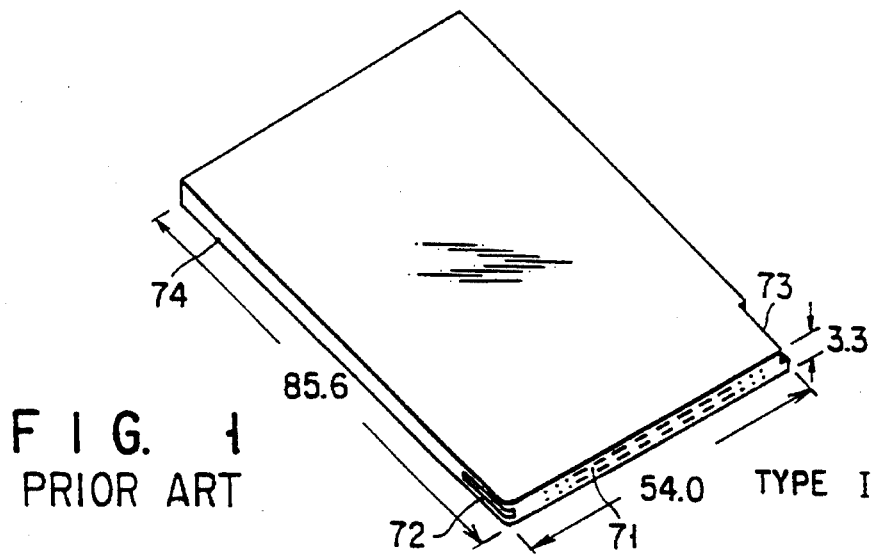
FIG. 1 is a perspective view showing the outer appearance of a memory card for explaining the standard (TYPE I) of a memory card.
Figure 2:
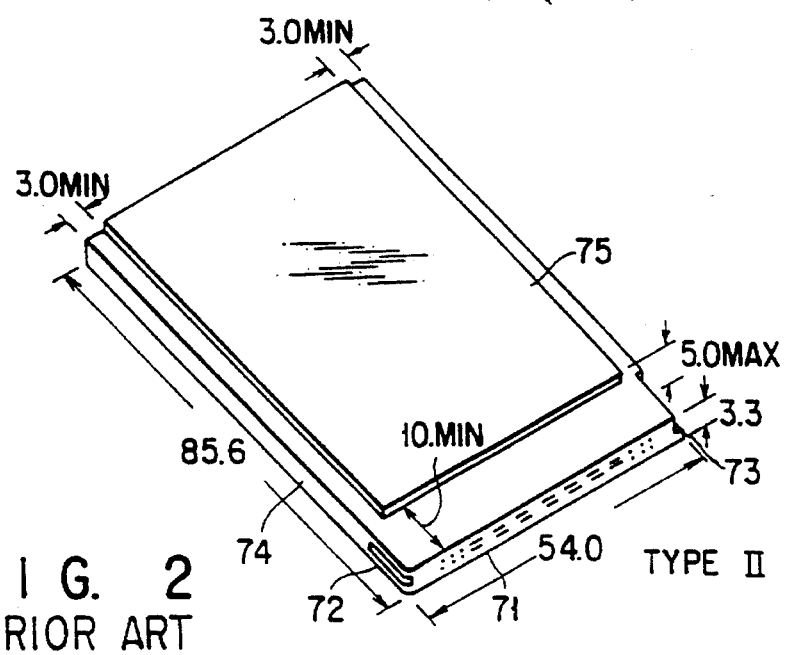
FIG. 2 is a perspective view showing the outer appearance of a memory card for explaining the standard (TYPE II) of a memory card.
Figure 3:
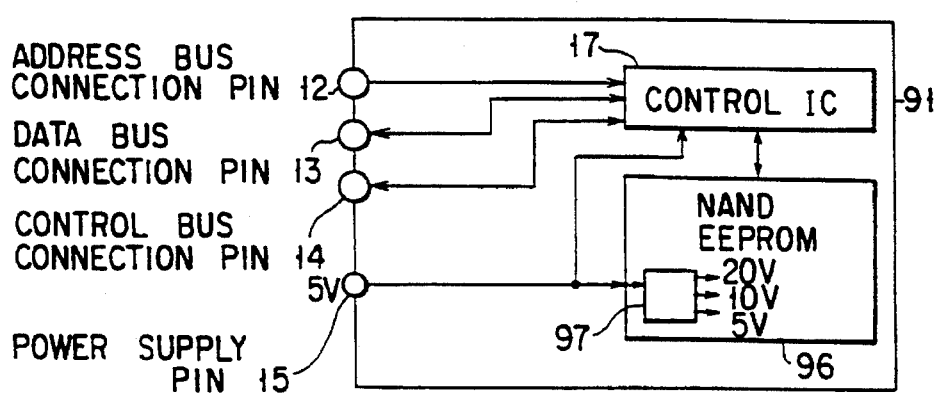
FIG. 3 is a block diagram showing the schematic arrangement of a conventional memory card.
Figure 4:
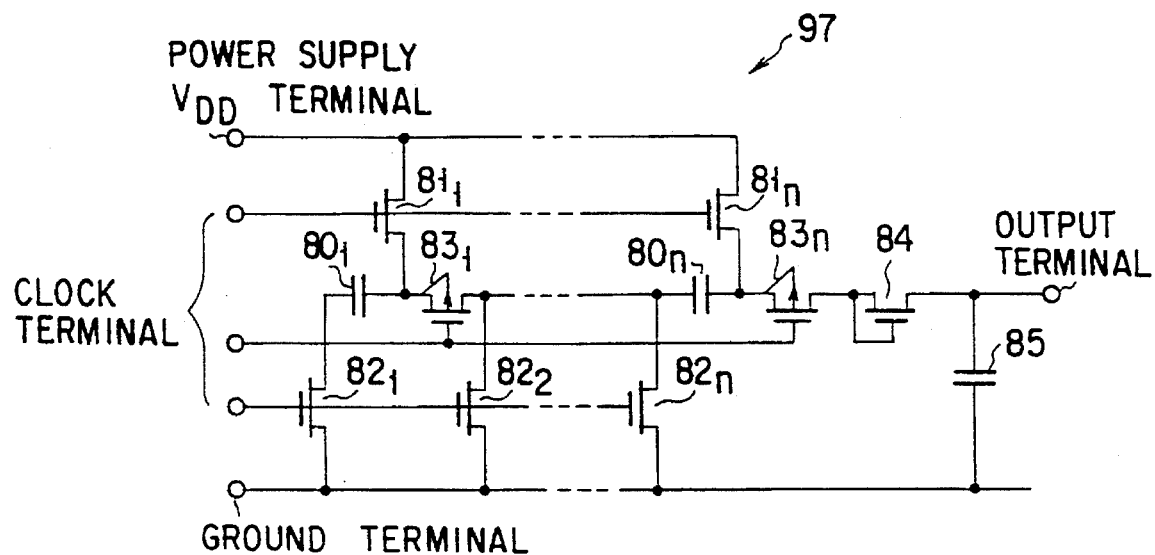
FIG. 4 is a circuit diagram showing the arrangement of a booster used in FIG. 3.
Figure 5:
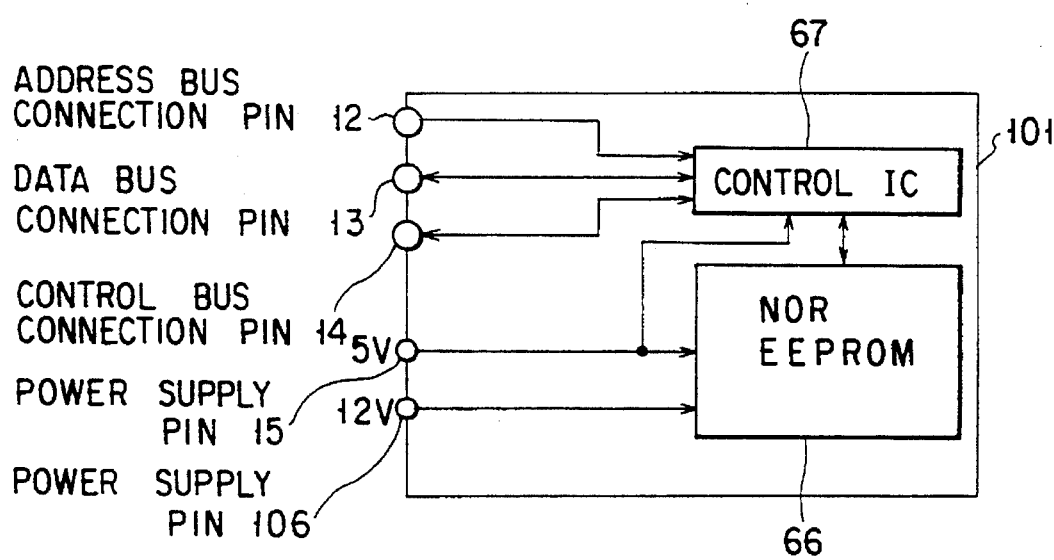
FIG. 5 is a block diagram showing the schematic arrangement of another conventional memory card.
Figure 6:
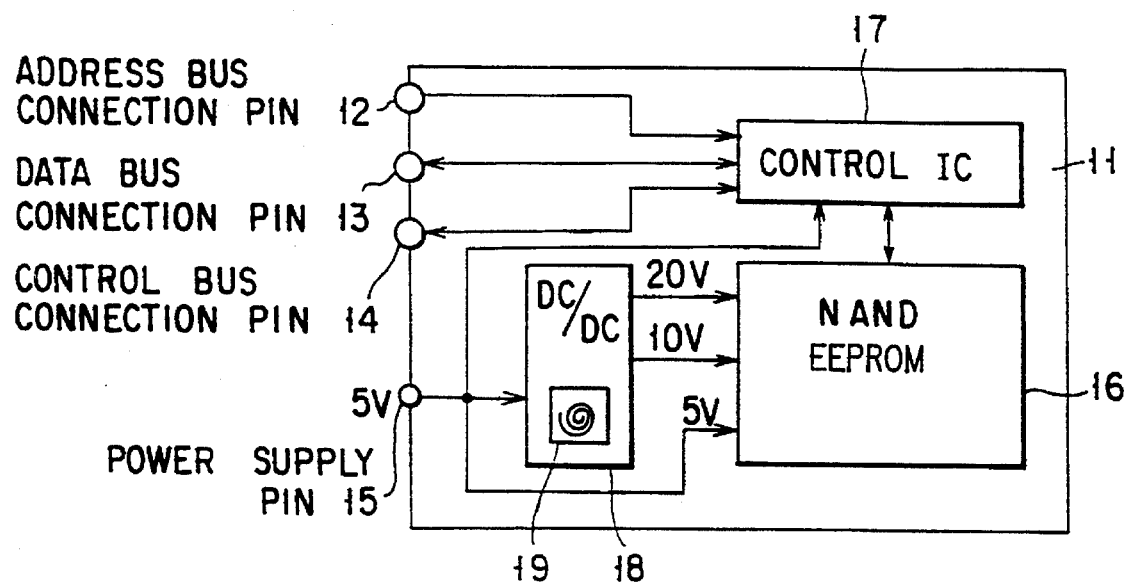
FIG. 6 is a block diagram showing the schematic arrangement of an IC memory card according to the first embodiment of the present invention.

FIG. 6 is a block diagram showing the schematic arrangement of an IC memory card incorporating a thin power supply according to the first embodiment of the present invention. A 68-pins connector (not shown) defined by PCMCIA Release 2.0 is arranged in a memory card main body 11 and constituted by address bus connection pins 12, data bus connection pins 13, control bus connection pins 14, a power supply pin 15, and the like. A plurality of NAND EEPROMs 16, a control IC 17, and a DC—DC converter 18 are arranged in the memory card 11 as needed. The control IC 17 writes or erases data in the memory cells of the NAND EEPROM 16 whose address is designated by an address signal under the control of a control signal externally supplied in use of the memory card 11. The DC—DC converter 18, as will be described later, is arranged as a thin power supply, i.e., a micro boosting power supply, having a thin planar inductor 19 and functions as a boosting converter for generating high voltages of 20 V and 10 V required for writing/ erasing data of the NAND EEPROM 16 from an external 5 V voltage input from the power supply pin 15. The DC—DC converter 18 incorporates the thin planar inductor 19 (to be described later) developed and proposed by the present inventors. The IC memory card according to the first embodiment of the present invention is realized for the first time using this thin planar inductor 19.

Although the write/erase operations of a NAND flash memory are performed using the FN tunneling phenomenon, a net tunnel current at a high voltage of 20 V applied to the gate or substrate is about 30 µA, and the current is 3 mA at most in consideration of rising of a control gate. At this time, when a power consumption is about 20 V×3 mA=60 mW. When this voltage of 20 V is generated by a charge pump booster incorporated in a conventional memory using an external 5 V power supply, a power of about 300 mW must be externally supplied to the memory card because the charge pump circuit has an efficiency of about 20%. However, as in the present invention, when an IC memory card incorporating a booster using a planar inductor is used, since the booster has an efficiency of about 80%, the voltage of 20 V can be obtained by externally supplying only a power of 75 mW to the memory card using the 5 V power supply. For this reason, not only a power consumption of the entire portable information device using an IC card but also the size of the power supply unit of the portable information device is decreased, thereby decreasing the size of the portable information device.

Figure 7:
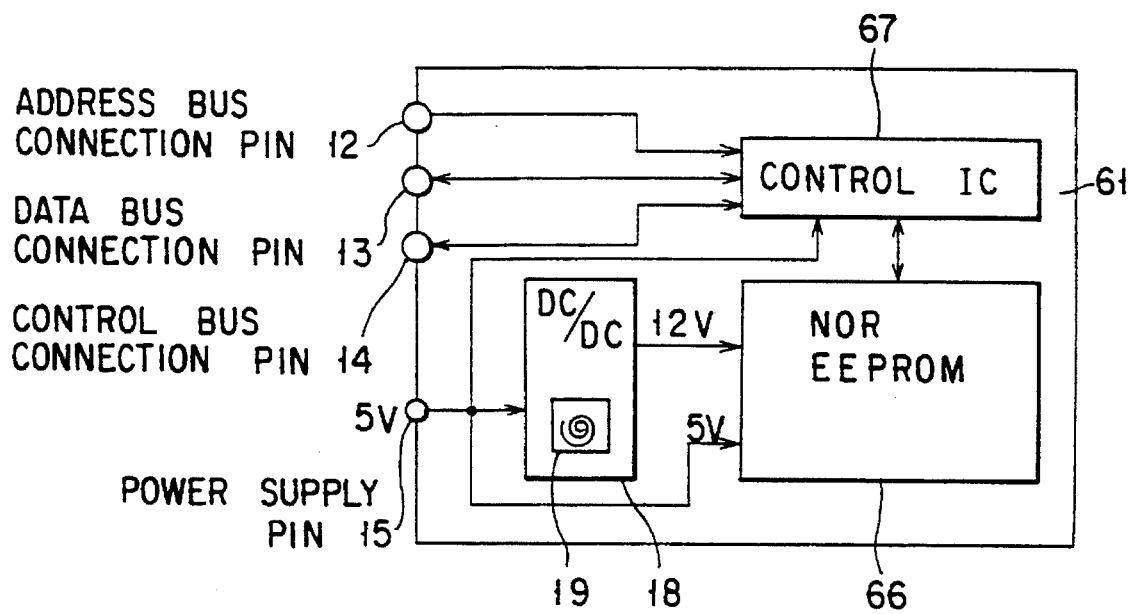
FIG. 7 is a block diagram showing the schematic arrangement of an IC memory card according to the second embodiment of the present invention.

FIG. 7 is a block diagram showing the schematic arrangement of an IC memory card incorporating a thin power supply according to the second embodiment of the present invention. A 68-pin connector defined by PCMCIA Release 2.0 is arranged in a memory card main body 61 and constituted by address bus connection pins 12, data bus connection pins 13, control bus connection pins 14, a power supply pin 65, and the like. A NOR flash memory 66, a control IC 67, and a DC—DC converter 18 are arranged in the memory card 61. The DC—DC converter 18 is arranged as a thin micro boosting power supply circuit having a planar inductor 19 to be described later, and is a boosting DC—DC converter for generating a high voltage of 12 V required for writing/erasing data of the NOR flash memory 66 from an external 5 V voltage input from the power supply pin 15. This DC—DC converter 18 can be realized to have the same thickness as that of the DC—DC converter 18 of the first embodiment.

A normal NOR flash memory is of a hot-electron injection type. A large current of about 30 mA flows in the NOR flash memory in a write operation, and the power consumption of the NOR flash memory is large, i.e., about 12 V×30 mA=360 mW. Therefore, the NOR flash memory cannot incorporate a charge pump type booster having a power conversion efficiency of about 20%, and must externally receive 5 and 12 V power supply voltages. According to the present invention, when the above thin DC—DC converter is mounted on the IC memory card, a power supply for applying a voltage to the IC memory card can be constituted by a single 5 V power supply as in a NAND flash memory. At this time, a power conversion efficiency is set to be 80%, a power consumption required for generating a voltage of 12 V is 450 mw which is larger than that used when the voltage of 12 V is externally applied. However, since a 12 V power supply circuit in a portable information device used in a conventional scheme has a power conversion efficiency almost equal to the above power conversion efficiency, the power consumption of the overall system is not changed. Therefore, a 12 V power supply is not required in the portable information device, and the size of the power supply unit of the portable information device can be considerably decreased, thereby decreasing the size of the portable information device.

The parts of the IC memory card according to the present invention will be described below with reference to the accompanying drawings.

Figure 8:
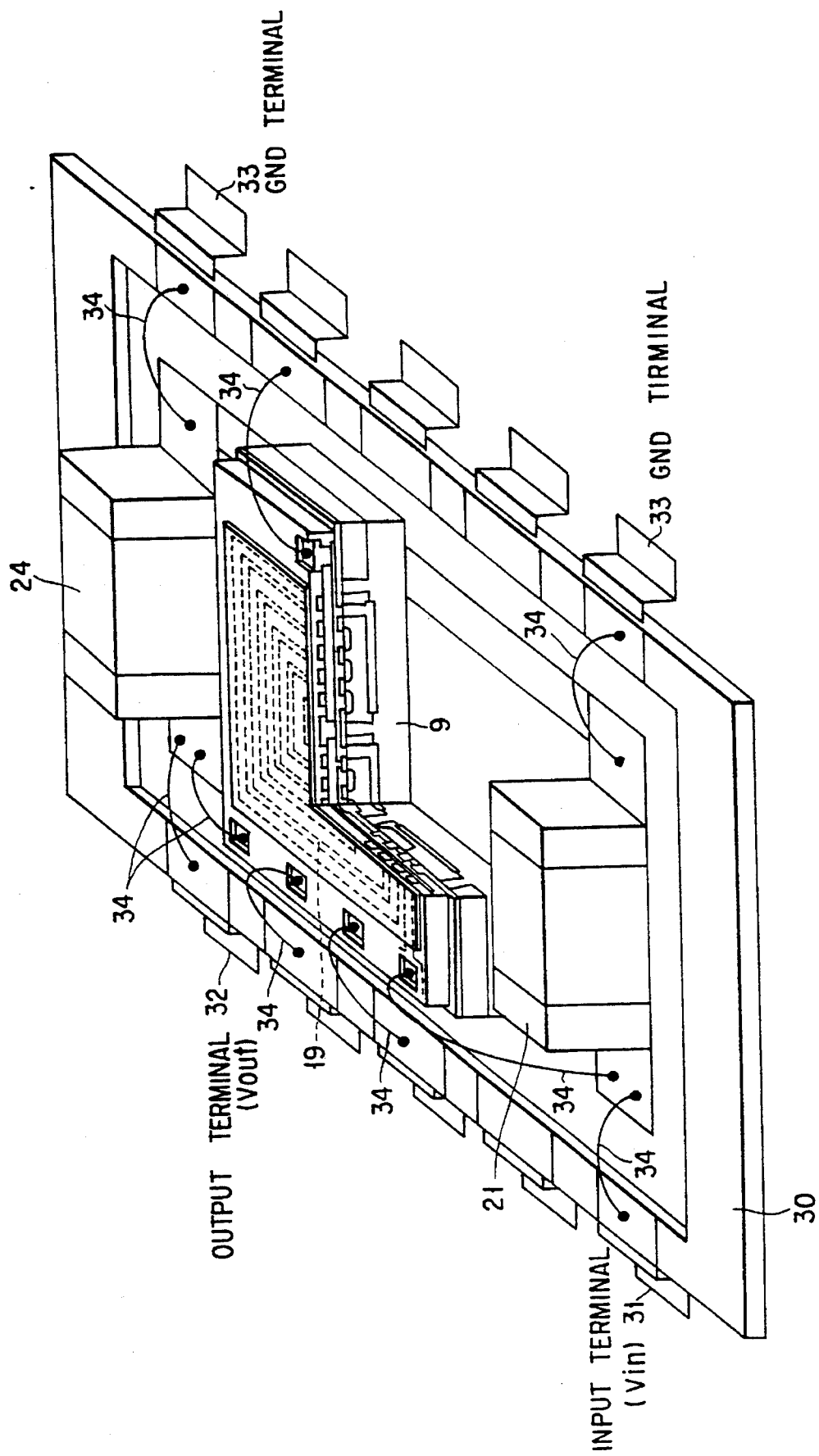
FIG. 8 is an enlarged perspective view showing a mounting state of an IC memory card according to the present invention.

FIG. 8 is an enlarged perspective view illustrating the mounting state of a micro boosting power supply unit used for the IC memory card according to the present invention. The IC memory card according to the present invention is packaged as follows. For example, as shown in FIG. 8, input and output capacitors 21 and 24 constituted by multilayered ceramic capacitors are arranged at the front and rear end portions of a high-heat conductive package 30 consisting of, e.g., AlN. A one-chip power supply unit 9 is arranged at the central portion of the high-heat conductive package 30. The parts of the one-chip power supply unit 9 and the parts of the input and output capacitors 21 and 24 are connected to terminals such as input and output terminals 31 and 32 and a GND terminal 33 of the package 30 through bonding wires 34. The entire package is sealed by a resin (not shown).

Figure 9:
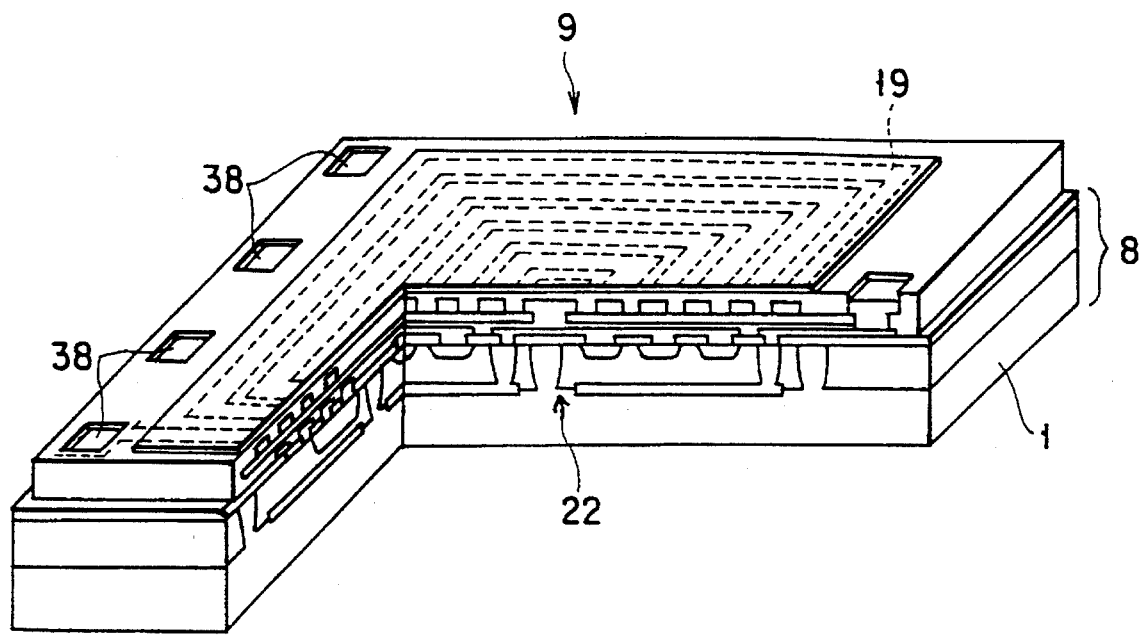
FIG. 9 is a perspective sectional view showing part of the arrangement of a one-chip memory of an IC memory card according to the present invention.

FIG. 9 is a perspective sectional view showing the schematic arrangement of the one-chip power supply unit for the IC memory card according to the present invention. The one-chip power supply unit 9 is constituted by a semiconductor IC unit 8 and the thin, planar inductor 19. The semiconductor IC unit 8 constituted by a control IC 17 or 67, a power MOSFET 22, a diode, and the like of a DC—DC converter 18 or 68 is formed on a semiconductor substrate 1. The thin planar inductor 19, as will be described later, is formed to be stacked on the semiconductor IC unit 8 as a magnetic thin-film inductor. Since the thin planar inductor 19 requires a large area, the thin planar inductor 19 is stacked to decrease the entire area of the card. Reference numeral 38 denotes a bonding pad portion.

Figure 10:
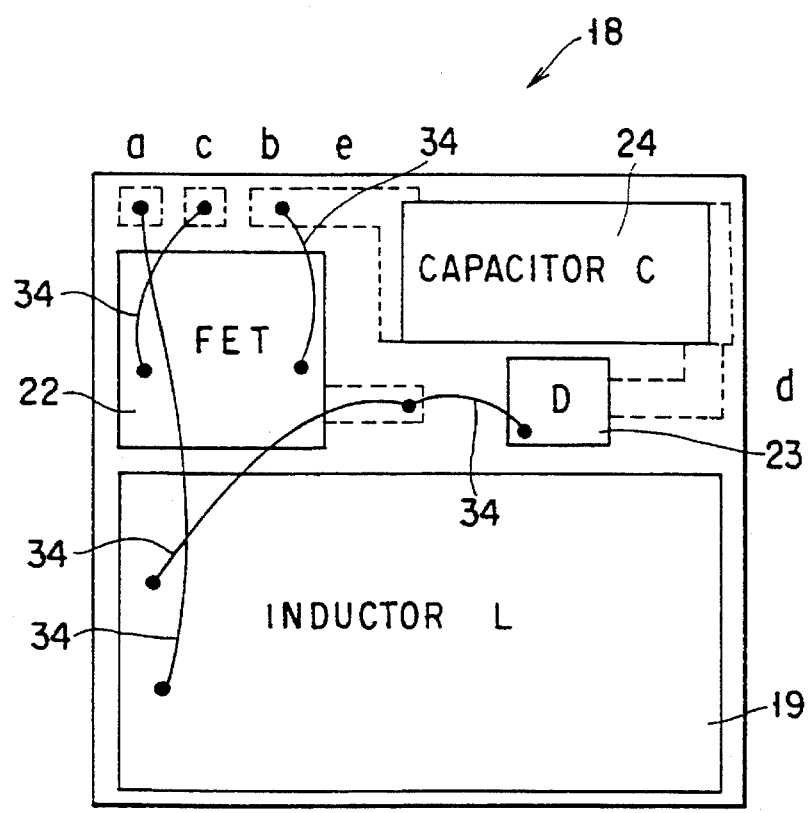
FIG. 10 is a plan view showing the arrangement of the parts of a DC—DC inverter according to the present invention.

FIG. 10 is a view showing the arrangements of the parts of the DC—DC converter in FIG. 6. This DC—DC converter 18 can be mounted to have a 7 mm square size. Thin chip parts are used for the MOSFET 22, a diode 23, and the capacitor 24, and a planar inductor (to be described later) is used as the inductor 19. As the planar inductor 19, a planar inductor disclosed in Jpn. Pat. Appln. KOKAI Publication No. 2-275606 or in Japanese Patent Application No. 4-204179 can be used. Parts are arranged in the DC—DC converter 68 in FIG. 7 in the same manner as described above.

Figure 11A:
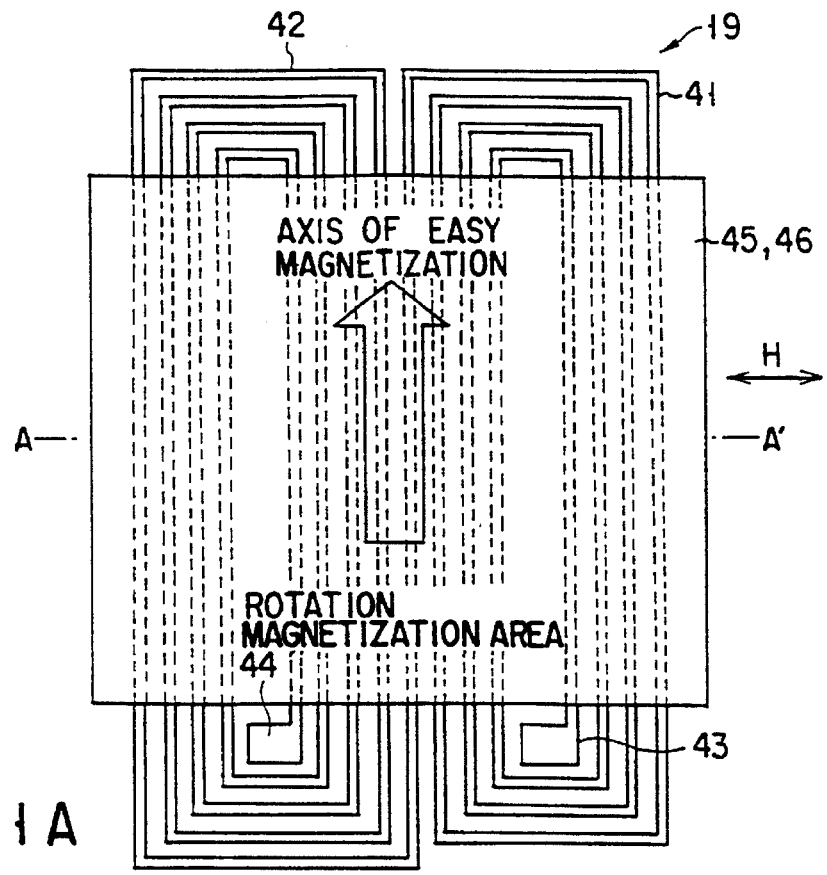
FIGS. 11A and 11B are plan and sectional views respectively showing the schematic arrangement of a planar inductor according to the present invention.
Figure 11B:
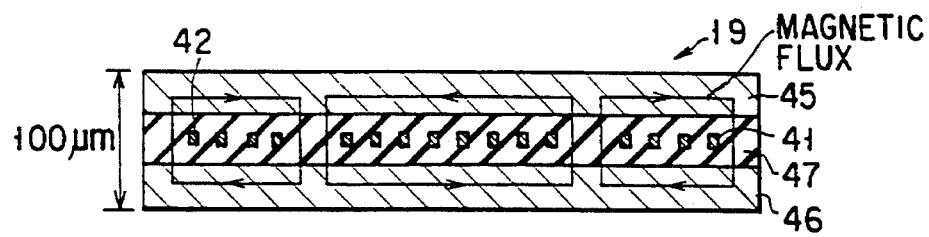
Figure 11C:
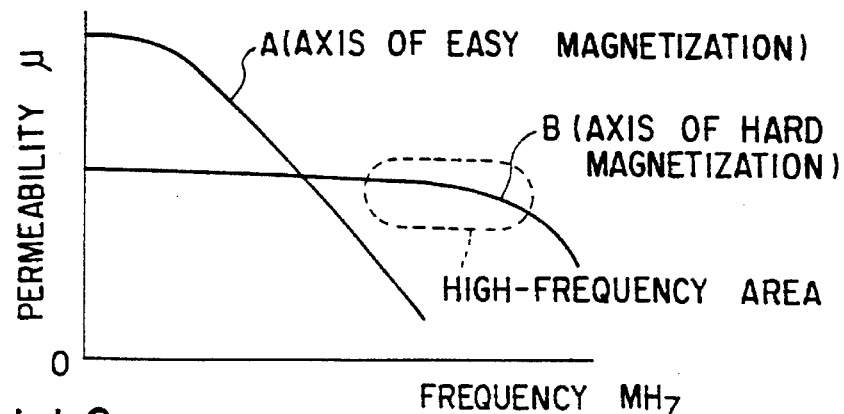
FIG. 11C is a graph showing the permeability-frequency characteristics of the planar inductor.

FIG. 11A is a plan view showing the schematic arrangement of a planar inductor according to the present invention, and FIG. 11B is a sectional view showing the arrangement of the planar inductor. Rectangular spiral coils 41 and 42 of the planar inductor 19 are constituted by aluminum or copper coils which are wound in opposite directions. The spiral coils 41 and 42 are arranged adjacent to each other. The spiral coil 41 starting from a terminal 43 is wound counterclockwise and extends to be connected to the spiral coil 42 which is wound clockwise. The end of the spiral coil 42 is connected to a terminal 44. The spiral coils 41 and 42, as shown in FIG. 11B, are buried in an insulator 47 and vertically sandwiched by the magnetic thin films 45 and 46 consisting of a CoZrNb amorphous material. Magnetic fluxes generated by the coils 41 and 42 are generated in the directions of arrows in FIG. 11B and have the same phase to influence each other. For this reason, although the coils are not large, a relatively large inductance can be obtained by the effect of a mutual inductance M (2L+M ≧2L, L: self-inductance). When a uniaxial magnetic anisotropic thin film is used as each magnetic thin film to generate a magnetic flux in the direction of an axis of hard magnetization (A–A' direction in FIG. 11A) perpendicular to the axis of easy magnetization, a high-frequency eddy-current loss can be decreased. That is, as shown in FIG. 11A, the spiral coils 41 and 42 are formed to have rectangular shapes. The axis of easy magnetization is defined as the direction of the long side of the rectangular shape coils. A magnetic field H is applied in the direction perpendicular to the axis of easy magnetization. The thin planar inductor 19 having the above arrangement can be formed to have a thickness of about 100 µm. For this reason, according to the present invention, the boosting DC—DC converters 18 and 68 can be formed to have small thicknesses. Referring to FIG. 11C, a curve A represents the relationship between a permeability µ and a frequency obtained when the magnetic field H is applied in the direction of the axis of easy magnetization of the planar inductor 19. A curve B represents the relationship obtained when the magnetic field H is applied in the direction of the axis of hard magnetization. In the DC—DC converter 18 operated at a high frequency, since the permeability µ of the curve B is higher than that of the carve A, the magnetic field H must be applied in the direction of hard magnetization.

FIG. 12 is a perspective view showing the schematic arrangement of another planar inductor according to the present invention. As another planar inductor, a planar inductor 19' using a circular spiral coil shown in FIG. 12 is known. A spiral coil 48 can be obtained such that a 70 µm copper plate is wound to have an inner diameter of 4 mm and an outer diameter of 9 mm and sliced to have a thickness of 500 µm. This spiral coil 48 is shielded in an insulator 51 and sandwiched by polyimide films 49. The resultant structure is sandwiched by soft magnetic foils 50 consisting of, e.g., a cobalt-based amorphous magnetic alloy. They are stacked and adhere to each other, thereby forming the slice coil type planar inductor 19'. The slice coil type planar inductor 19' has an entire thickness of about 800 µm. When the thin planar inductor 19' is used, an inductor having an inductance of about 30 µH can be incorporated in an IC card. Note that, when a circuit uses a transformer, this circuit may be arranged such that primary and secondary coils are sandwiched by magnetic materials.

FIG. 13 is a block diagram showing the connection between the DC—DC converter according to the present invention and a memory. An external power supply (not shown) for applying a voltage of 5 V, the DC—DC converter 18, a series regulator 53, and memory cells, e.g., EEPROM cells 54 are connected in series to each other. The series regulator 53 is incorporated in a memory device together with the memory cells 54. In a NAND EEPROM, a write operation to a memory cell having a floating gate structure is performed using FN tunneling injection as described above, and a voltage of about 20 V is required. In fact, the write/erase voltages of each memory cell have variations. In order to compensate these variations, the following scheme is employed. That is, the write voltage is sequentially increased from the minimum value, e.g., 19 V of the write voltage of each memory cell to the maximum value, e.g., 23 V thereof, data are written at respective voltages. The voltage can be changed using a dropping regulator such as the series regulator 53 incorporated in the EEPROM 16 (or 66). For example, when the external power supply voltage is set to be 5 V, the voltage is boosted by the DC—DC converter 18 to a value, e.g., 24 V, which is slightly larger than the maximum value required for a write operation. The series regulator 53 receives an output from the DC—DC converter 18 to drop the voltage to 19 to 23 V, thereby sequentially performing write operations. That is, the output voltage from the series regulator 53 is controlled by control voltage signals fed back from the memory cells 54. The output voltage is determined depending on the variation in characteristics of the memory cells. The efficiency of the series regulator 53 is high, i.e., 90%, and the DC—DC converter 18 according to the present invention can obtain an efficiency of 80% such that a frequency is increased using a flat magnetic element. For this reason, according to the present invention, when this power supply drive scheme is used, a power supply efficiency of about 70% can be achieved. Since an efficiency of 20% can be obtained at most in a conventional charge pump type power supply, the present invention largely contributes to a high efficiency, i.e., a decrease in power consumption. Trimming of a plurality of constant voltage diodes connected to the output terminal of a power supply using a charge pump scheme to compensate a variation in each chip is conventionally performed. However, when a range in which the voltage of the series regulator can be changed is widened, the trimming can be omitted. Since the DC—DC converter 18, as will be described later, has a large boosting voltage ratio, the DC—DC converter 18 can cope with a decrease in voltage of the external power supply. When a duty ratio D of the switching element of the DC—DC converter 18 iS PWM-controlled, the DC—DC converter 18 can cope with a plurality of different external power supply inputs. A 10 V output of the outputs of the DC—DC converter in FIG. 13 is used as a protect voltage which is applied after the write operation of the memory cell is completed.

FIG. 14A is a perspective view showing the arrangement of a memory card according to the present invention, and FIG. 14B is a perspective view showing the arrangement of a memory chip according to the present invention. As shown in FIG. 14A, as the arrangement of the memory card 11 or 61, a boosting power supply unit receiving a power from an external power supply such as the DC—DC converter 18 can be mounted on the card 11 or 61 so as to be commonly used for the plurality of memory chips 16. In this case, only the series regulator portion is incorporated in the memory chip 16, and the DC—DC converter 18 is mounted on the card so as to be commonly used for the memory chips 16. A control IC is not illustrated and also wirings are not shown in FIG. 14A. In FIG. 14B, a micro boosting power supply unit 18 is incorporated in a memory chip 16a together with the series regulator 53, the memory cells 54, and a peripheral circuit 55 to form one chip. A memory card is constituted by this memory chip.

Figure 15A:
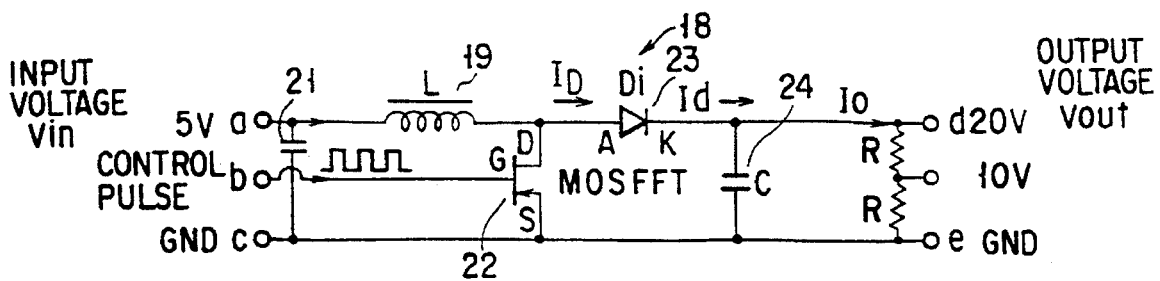
FIGS. 15A to 15E are circuit diagrams respectively showing the arrangements of DC—DC converters according to the present invention.
Figure 15B:
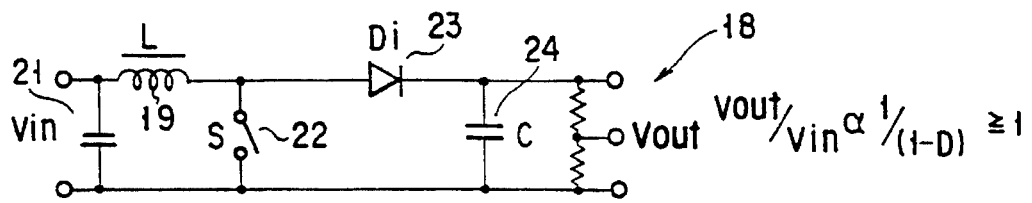
Figure 15C:
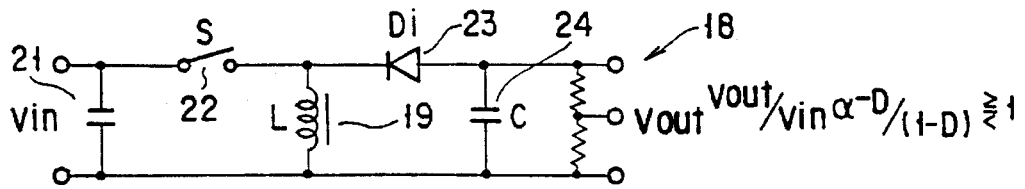
Figure 15D:
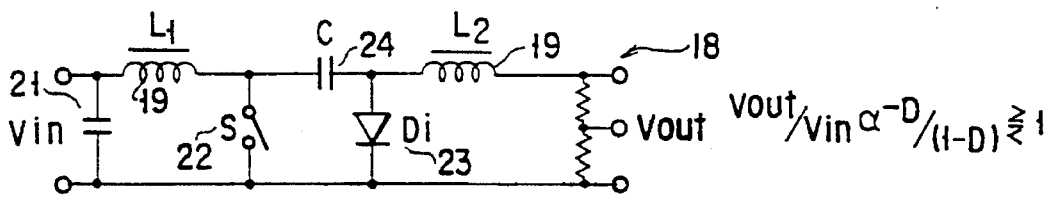
Figures 15E, 15F:
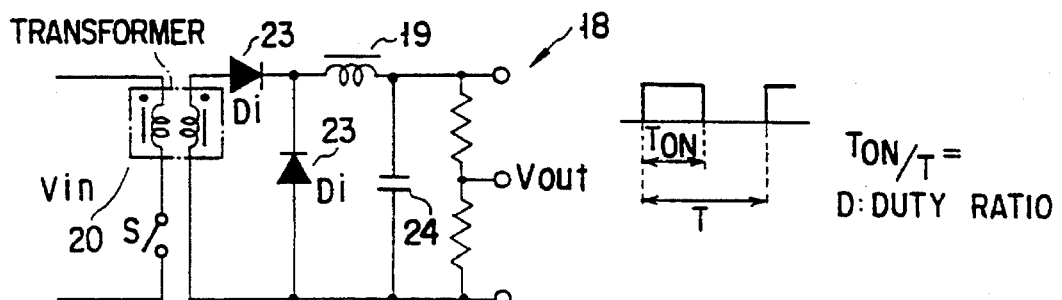
FIG. 15F is a waveform chart for explaining a duty ratio.

FIGS. 15A to 15E are circuit diagrams respectively showing arrangements of DC—DC converters according to the present invention. A DC—DC converter 18 shown in FIG. 15A is a boosting DC—DC converter constituted by the input capacitor 21 for suppressing the variation in voltage of an input terminal caused by charging/discharging operations of the inductor 19, the thin planar inductor 19 operated as a flyback coil, the switching transistor 22 for ON/OFF-controlling a current, the rectifier diode 23, and the output capacitor 24 for smoothing the pulsation of an output current. A DC—DC converter 18 in FIG. 15B is obtained such that the MOSFET 22 in FIG. 15A is used as a switch 22, and its boosting voltage ratio Vout/Vin is in proportion to 1/(1−D). In this case, D represents a duty ratio defined by D=$T_{ON}$/T shown in FIG. 15F. A DC—DC converter 18 shown in FIG. 15C is a boosting/dropping DC—DC converter obtained by reversing the positions of the planar inductor 19 and the switch 22 in FIG. 15B. The boosting/dropping voltage ratio Vout/Vin is in proportion to −D/(1−D). A DC—DC converter 18 shown in FIG. 15D is also a boosting/dropping DC—DC converter obtained by reversing the positions of the rectifier diode 23 and the output capacitor 24 and adding another planar inductor 19. The boosting/dropping voltage ratio Vout/Vin is in proportion to −D/(1−D). FIG. 15E shows a DC—DC converter 18 using the inductance of a transformer 20 without using a single inductor as a planar inductor. According to the present invention, the transformer 20 can be mounted as a flat magnetic element. In FIGS. 15A to 15E, the protect voltage required after completing the write operation can be obtained by dividing the output voltage Vout by resistances R. This is because the protect voltage can be almost neglected in contrast to the voltage required at the time of the write operation.

FIG. 16 is a circuit diagram showing the arrangement of a series regulator. Reference symbol Q1 denotes a transistor operating as a variable resistor. A transistor Q2 is turned on in response to a control voltage signal applied from the memory cells to the base of the transistor Q2 and controls the base current of the transistor Q1 to change the resistance of the transistor Q1. When the resistance of the transistor Q1 is represented by $R_{Q1}$ and the load resistance thereof is represented by $R_L$ (not shown), the resistance $R_{Q1}$ can be variably changed such that the following equation is established:

$$Eo/Ei=R_L/(R_{Q1}+R_L)=\text{constant}$$

For example, when the input voltage Ei=24 V, the output voltage Eo can be controlled by changing the resistance $R_{Q1}$ in a range of Eo=19 to 23 V.

FIG. 17 is a waveform chart for explaining the operation of the DC—DC converter shown in FIG. 15A. An input voltage of 5 V is applied to a terminal a of the DC—DC converter shown in FIG. 15A. A control pulse having a rectangular shape shown in FIG. 17A is input to a terminal b of the DC—DC converter. When the switching transistor 22 is turned on by a control pulse, as shown in FIG. 17B, the source-drain voltage of the MOSFET 22 is changed. As shown in FIG. 17C, a current $I_D$ flows in the thin planar inductor 19 to accumulate electromagnetic energy in the thin inductor 19. When the switching transistor 22 is turned off, a current flowing in a thin inductor 19 is interrupted, and pulse-like high voltage is generated across the thin inductor 19. The pulse-like voltage is smoothed by the rectifier diode 23 (FIG. 17D) and the smoothing capacitor 24, and, as shown in FIG. 17E, a smoothed output current Io can be obtained. Therefore, an output voltage Vout of 10 or 20 V which is higher than an input voltage Vin can be obtained.

FIGS. 18A to 18D are sectional views for explaining the steps of forming a planar inductor (coil) according to the present invention. In order to form an inductor constituting a DC—DC converter in a semiconductor chip, a thin-film process is preferably used. For example, in this case, methods disclosed in Japanese Patent Application Nos. 3-121681, 3-158019, 4-372, 4-63453, and 4-71986 can be used. These methods will be briefly described below. As shown in FIG. 18A, a lower magnetic film (a soft magnetic film such as a CoZrNb-based amorphous thin film) 3 is formed on a semiconductor substrate 1 such as an Si substrate through an insulating film 2 such as an oxide film. An insulating film 4 such as a polyimide film is formed on the lower magnetic film 3. As shown in FIG. 18B, the insulating film 4 is unevenly patterned by a pattern forming process using a resist 31 such that the recessed portion of the insulating film 4 have a flat coil shape. A conductor is selectively filled in the recessed portion to form a coil pattern. At this time, AZ-Si-Cu alloy films are formed on the bottom surface of the recessed portion as the spiral coils 41 and 42. As shown in FIG. 18C, an AP 5 is selectively grown in the recessed portion by CVD using dimethylaluminum hydride (DMAIH). The AP5 can also be grown by plating. In this case, Cu or the like can be used as a conductor. Thereafter, as shown in FIG. 18D, an upper magnetic film 7 is formed through an insulating film 6 such as an SiO$_2$ film to complete a flat magnetic element. Note that the conductor of the flat magnetic element must be a resistor because the flat magnetic element is used in a power element application. The flat magnetic element whose density is not high requires a large space for obtaining a self-inductance L. Therefore, the aspect ratio of the conductor is preferably given by a/b≧1, and an inter-conductor aspect ratio is preferably given by a/c=1 (FIG. 18D).

A DC—DC converter used as a variable power supply having a high efficiency is not only applied to the EEPROM described above but also to all fields requiring a power supply such as a power supply for a power amplifier of mobile communication, an analog IC, or a CPU, requiring a variable output and a high conversion efficiency. Therefore, a low power consumption can be achieved, the size of a power supply unit for an electronic device such as personal computer or a wordprocessor, and more particularly, the size of a portable information device such as a movable telephone can be decreased, and long-time driving using a battery can be achieved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a semiconductor element driven by a predetermined DC power supply voltage; and
    a power supply circuit including a DC—DC converter for converting an input DC voltage to an output DC voltage by means of a switching converter scheme using an inductance element and a switching element, and a regulator for converting said output DC voltage to said predetermined DC power supply voltage to supply said predetermined DC power supply voltage to said semiconductor element.

2. A device according to claim 1, wherein said semiconductor element is constituted by a CPU.

3. A device according to claim 1, wherein said semiconductor element is constituted by an analog IC.

4. A semiconductor memory comprising:
    memory cells formed on a chip and driven by a predetermined DC power supply voltage; and
    a micro boosting power supply circuit having a booster type DC—DC converter for boosting an input DC voltage by means of a switching converter scheme using an inductance element and a switching element to generate an output DC voltage, and a dropping regulator for dropping said output DC voltage to said predetermined DC power supply voltage to supply said predetermined DC power supply voltage to said memory cells.

5. A memory according to claim 4, wherein said memory cells and said micro boosting power supply circuit are formed on the same chip as an integrated circuit.

6. A memory according to claim 5, wherein said inductance element is constituted by a planar inductor, said planar inductor is constituted by two rectangular thin-film spiral coils wounded in opposite directions and arranged adjacent to each other, an insulating thin film for burying said thin-film spiral coils, and magnetic thin films formed on the upper and lower surfaces of said insulating thin film.

7. A memory according to claim 5, wherein said inductance element is constituted by a planar inductor, said planar inductor is constituted by a rectangular coil, magnetic members having a uniaxial magnetic anisotropic characteristic in a major axis direction, and an insulating film interposed between said magnetic members so as to bury said rectangular coil.

8. A memory according to claim 4, wherein said booster type DC—DC converter is constituted by a planar inductor serving as an inductance element, a MOSFET serving as a switching element, a capacitor serving as a capacitance element, and a diode serving as a rectifier element, all being formed on the same substrate.

9. A memory according to claim 8, wherein said planar inductor is constituted by two rectangular thin-film spiral coils wounded in opposite directions and arranged adjacent to each other, an insulating thin film for burying said thin-film spiral coils, and magnetic thin films formed on the upper and lower surfaces of said insulating thin film.

10. A memory according to claim 8, wherein said planar inductor is constituted by a rectangular coil, magnetic members having a uniaxial magnetic anisotropic characteristic in a major axis direction, and an insulating film interposed between said magnetic members so as to bury said rectangular coil.

11. A memory according to claim 4, wherein said memory cells are constituted by a NAND EEPROM, and said micro boosting power supply circuit generates DC voltages having at least two voltage levels higher than that of an external DC voltage from said external DC voltage.

12. A memory card comprising:
    a semiconductor memory constituted by a plurality of memory cells driven by a predetermined DC power supply voltage;
    a micro boosting power supply circuit having a booster type DC—DC converter for boosting an input DC voltage by means of a switching converter scheme using an inductance element and a switching element to generate an output DC voltage, and a dropping regulator for dropping said output DC voltage to said predetermined DC power supply voltage to supply said predetermined DC power supply voltage to said plurality of memory cells; and
    a control circuit for controlling write/erase operations of said semiconductor memory in accordance with an external control signal.

13. A card according to claim 12, wherein said boosting DC—DC converter is constituted by a planar inductor serving as an inductance element, a MOSFET serving as a switching element, a capacitor serving as a capacitance element, and a diode serving as a rectifier element, all being formed on the same substrate.

14. A card according to claim 13, wherein said planar inductor is constituted by two rectangular thin-film spiral coils wounded in opposite directions and arranged adjacent to each other, an insulating thin film for burying said thin-film spiral coils, and magnetic thin films formed on the upper and lower surfaces of said insulating thin film.

15. A card according to claim 12, wherein said inductance element is constituted by a planar inductor, said planar inductor is constituted by a rectangular coil, magnetic members having a uniaxial magnetic anisotropic characteristic in a major axis direction, and an insulating film interposed between said magnetic members so as to bury said rectangular coil.

16. A card according to claim 12, wherein said booster type DC—DC converter is formed independently of said plurality of memory cells of said semiconductor memory, and is connected to a plurality of memory chips such that a drive power supply voltage is commonly applied to said plurality of memory chips.

17. A card according to claim 12, wherein said booster type DC—DC converter is formed to be incorporated independently into each memory chip of said semiconductor memory, and applies a drive power supply voltage to each memory chip.

18. A method of driving a power supply of an EEPROM, comprising the steps of:

applying a first DC voltage from an external power supply;

causing a DC—DC converter to boost said first DC voltage by means of a switching converter scheme using an inductance element and a switching element to convert said first DC voltage to a second DC voltage;

dropping said second DC voltage by a dropping regulator to convert said second DC voltage to a predetermined third DC voltage for driving said EEPROM; and applying said third DC voltage to said EEPROM as a drive power supply voltage.

19. A method according to claim 18, wherein DC—DC conversion by means of the switching converter scheme is performed using a high-frequency control pulse.

20. A method according to claim 18, wherein said inductance element is constituted by a planar inductor, said planar inductor is constituted by a rectangular coil, magnetic members having a uniaxial magnetic anisotropic characteristic in a major axis direction, and an insulating film interposed between said magnetic members so as to bury said rectangular coil.

\* \* \* \* \*